United States Patent
McFeely et al.

(10) Patent No.: US 7,884,018 B2
(45) Date of Patent: Feb. 8, 2011

(54) METHOD FOR IMPROVING THE SELECTIVITY OF A CVD PROCESS

(75) Inventors: Fenton R. McFeely, Ossining, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 652 days.

(21) Appl. No.: 11/850,916

(22) Filed: Sep. 6, 2007

(65) Prior Publication Data

US 2008/0315429 A1      Dec. 25, 2008

Related U.S. Application Data

(63) Continuation-in-part of application No. 11/766,261, filed on Jun. 21, 2007.

(51) Int. Cl.
 *H01L 21/44* (2006.01)
(52) U.S. Cl. .................. 438/686; 438/680; 438/641; 438/674; 438/675; 438/676; 438/677; 257/773; 257/E23.01; 257/E23.162; 257/E21.006
(58) Field of Classification Search ............ 438/641, 438/674–677; 257/E23.162, E21.006
See application file for complete search history.

(56) References Cited

U.S. PATENT DOCUMENTS

| 5,585,673 | A | 12/1996 | Joshi et al. |
| 5,695,810 | A | 12/1997 | Dubin et al. |
| 6,323,554 | B1 | 11/2001 | Joshi et al. |
| 6,342,733 | B1 | 1/2002 | Hu et al. |
| 6,696,758 | B2 * | 2/2004 | Dubin et al. ............... 257/750 |
| 6,706,625 | B1 | 3/2004 | Sudijono et al. |
| 7,026,714 | B2 | 4/2006 | Cunningham |
| 2004/0113279 | A1 | 6/2004 | Chen et al. |
| 2005/0001325 | A1 * | 1/2005 | Andricacos et al. ......... 257/762 |

OTHER PUBLICATIONS

Green et al. ("Chemical vapor deposition of Ruthenium and Ruthenium dioxide films", J. Electrochemical Soc., vol. 132, Issue 11, pp. 2677-2685, 1985).*

* cited by examiner

*Primary Examiner*—Charles D Garber
*Assistant Examiner*—Yasser A Abdelaziez
(74) *Attorney, Agent, or Firm*—Cantor Colburn LLP; Vazken Alexanian

(57) ABSTRACT

A method of forming a noble metal cap on a conductive material embedded in a dielectric material in an interconnect structure. The method includes the step of contacting (i) a conductive material having a bare upper surface partially embedded in a dielectric material and (ii) vapor of a noble metal containing compound, in the presence of carbon monoxide and a carrier gas. The contacting step is carried out at a temperature, pressure and for a length of time sufficient to produce a noble metal cap disposed directly on the upper surface of the conductive material without substantially extending into upper surface of the dielectric material or leaving a noble metal residue onto the dielectric material.

23 Claims, No Drawings

METHOD FOR IMPROVING THE SELECTIVITY OF A CVD PROCESS

CROSS-REFERENCE TO RELATED APPLICATION

This application is a Continuation-In-Part of and claims priority from U.S. application Ser. No. 11/766,261, by Yang and Edelstein, Filed on Jun. 21, 2007, and entitled "Metal Cap With Ultra-Low k Dielectric Material For Circuit Interconnect Applications," the entire contents of which are incorporated herein by reference for all purposes as set forth herein.

FIELD OF THE INVENTION

The present invention relates to a method of selectively depositing a metal capping layer on a Cu wire in the wiring arrays in very large scale integrated (VLSI) circuits. More particularly, the present invention relates to a method of selectively depositing a metal capping layer on the Cu wires in the wiring arrays in very large scale integrated (VLSI) circuits by a Chemical Vapor Deposition (CVD) process using a ruthenium carbonyl compound, such as, $Ru_3(CO)_{12}$ and/or $Ru(CO)_5$.

DESCRIPTION OF RELATED ART

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures.

The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction of the bottom of the interconnect structure. This eventually results in a circuit dead opening.

It has been shown that by replacing the Cu/dielectric interface with a Cu/metal interface can enhance electromigration resistance by greater than 100×.

Prior art metal caps are typically comprised of a Co-containing alloy such as, for example, CoWP, which is selectively deposited atop of the Cu conductor region of the interconnect structure. One problem with utilizing such selective deposited metal caps is that some of the metal cap may extend onto the adjoining surface of the interconnect dielectric material and, as a result, electrical shorts between adjacent interconnects can arise.

To avoid this problem, it is desirable to deposit a capping layer selectively onto the Cu wires in VLSI wiring arrays. An important function of this cap is to suppress electromigration of the Cu, which can lead to void formation and failure.

It is generally known in the art that metal caps are superior to dielectric caps in the suppression of electromigration induced voiding. Accordingly, there is a need in industry to provide a method of selectively depositing a metal onto the Cu wire, but not onto the dielectric matrix surrounding it, because depositing a metal onto the dielectric matrix surrounding the copper wire could lead to electrical shorts.

The present invention addresses this need by providing a method which can selectively deposit a metal onto the Cu wire in VLSI wiring arrays without depositing the metal onto the dielectric matrix surrounding it.

SUMMARY OF THE INVENTION

The present invention provides such a method which can selectively deposit a noble metal capping layer on the Cu wires in the wiring arrays in very large scale integrated (VLSI) circuits by a Chemical Vapor Deposition (CVD) process using a ruthenium carbonyl compound, such as, $Ru_3(CO)_{12}$ and/or $Ru(CO)_5$.

Accordingly, the present invention provides a method of forming a noble metal cap on a conductive material embedded in a dielectric material in an interconnect structure.

The method includes the step of:

contacting (i) a conductive material having a bare upper surface partially embedded in a dielectric material and (ii) vapor of a noble metal containing compound, in the presence of a carrier gas free of carbon monoxide;

wherein the contacting step is carried out at a temperature, pressure and for a length of time sufficient to produce a noble metal cap disposed directly on the upper surface of the conductive material without substantially extending into an upper surface of the dielectric material or leaving a noble metal residue onto the surface of the dielectric material.

Interconnect structures having a noble metal capping layer fabricated by the present method have enhanced electromigration reliability and improved technology extendibility without degrading circuit short yield.

DESCRIPTION OF THE PREFERRED EMBODIMENTS

In a preferred embodiment of the present invention, the metal of the capping layer is selected to ensure compatibility with subsequent fabrication steps, including steps such as cleaning. Accordingly, inert metals, including particularly noble metals and alloys thereof, are preferred. Among the preferred noble metals, ruthenium metal is most preferred.

Selective deposition is known in the art. However, its use in the applications considered here has been limited to specific systems, such as, CoWP. Thus, selective deposition has been used in solution based plating methods to deposit CoWP.

However, CoWP is not sufficiently resistant to treatment with dilute HF to make it useful in selectively depositing a metal capping layer on the Cu wires in the wiring arrays in very large scale integrated (VLSI) circuits.

In the commonly owned and previously incorporated U.S. application Ser. No. 11/766,261, of Yang and Edelstein appear to have observed some low level selectivity exhibited by Ru CVD in depositing an acid resistant capping layer onto the Cu wires. However, the selectivity exhibited by this standard Ru CVD process is only marginal and, as such, is insufficient to selectively deposit a metal capping layer on the Cu wires in the wiring arrays in very large scale integrated (VLSI) circuits.

In contrast to method described above, the present invention provides substantial improvement in the selectivity of the deposition of a metal capping layer on Cu wires embedded in a low dielectric constant k material in wiring arrays in very large scale integrated (VLSI) circuits by a Chemical Vapor Deposition (CVD) process using a ruthenium carbonyl compound, such as, $Ru_3(CO)_{12}$, or $Ru(CO)_5$, facilitating the fabrication of such metal caps.

Accordingly, the present invention provides a method which enables the fabrication of a semiconductor interconnect structure having enhanced electromigration (EM) reliability in which a noble metal cap, such as, a ruthenium metal cap, is located directly on a surface of a conductive material, i.e., copper, which conductive material is embedded within the low dielectric constant k dielectric material.

Chemical vapor deposition of Ru requires a Ru containing precursor, including a precursor, such as $Ru_3(CO)_{12}$. Due to the low vapor pressure of this compound, it is necessary to maintain the precursor at an elevated temperature, typically in the range from about 50° C. to about 100° C. However, when this compound is held at about 50° C. to about 100° C. temperature in vacuum or under an inert atmosphere, it slowly decomposes by loss of CO groups which not only is wasteful, but it also leads to particulate contamination problems by precipitation of decomposition by-products. Accordingly, in the prior art, the ruthenium carbonyl is stored in the ampoule in an atmosphere comprising carbon monoxide.

In the prior art Ru deposition processes, ruthenium carbonyl is entrained in a carrier gas including carbon monoxide and an inert gas, such as argon. The CO in the carrier gas stream has the effect of chemisorbing on the growing Ru film and thus blocking the sites for the decomposition of the ruthenium carbonyl precursor. This decreases the deposition rate, and brings the deposition process out of a precursor transport limited to a surface reaction rate limited regime.

This decrease in reaction rate would normally be considered deleterious, however, by moving the process into the surface reaction rate limited regime, the inclusion of carbon monoxide in the carrier gas may improve the conformality of the deposition process. However, we note that the fabrication of metal capping layers as described above involves deposition on essentially planar structures, so that the enhanced conformality provides no significant benefit.

To form Ru caps on Cu in the presence of a dielectric, the standard Ru CVD process, employing Ruthenium carbonyl entrained in a carrier gas comprising CO and Argon has been used (ref Yang and Edelstein). This approach exploits the difference in induction times exhibited between Cu and dielectric for the standard Ru CVD process.

The term "induction time" is defined herein as the time interval between the initial exposure of the Ruthenium Carbonyl precursor to the surface in question at the onset of Ru deposition. The induction time on Cu is essentially zero while on dielectrics it can be as large as 60 sec. Accordingly, during this time, a capping layer can be grown which does not extend onto the dielectric.

A major drawback of using this prior art chemistry is that only about 2 nm of Ru can generally be grown. While the Ru growth rate on Cu could be increased by increasing the reaction temperature, however, this also will reduce the incubation time of the dielectric. What is desired therefore is to increase the deposition rate of the Ru on the Cu without affecting the incubation time on the dielectric.

The CO clearly has no effect on the induction time for Ru deposition on Cu, since this time is negligibly small. The CO will also have no effect on the incubation time of the dielectric, because it is well known that CO chemisorbs only weakly, if at all, on the surfaces of such materials. However, the CO reduces the growth rate of the Ru film, and thus, the amount of Ru that can be grown on the Cu conductor during the incubation period for the nucleation of growth on the dielectric. Since the wiring structure to be deposited upon is essentially planar, the compensating advantage of the CO, conformality, is moot.

Without being bound by any theory or structure, it is believed that in the present invention, the removal or substantial reduction of CO from the precursor gas stream during deposition increases the growth rate of Ru on the Cu conductor during the incubation period for nucleation on the dielectric. This allows the fabrication of thicker layers of Ru on the Cu conductor, still without leaving metal or a metal containing residue on the dielectric.

It will still be necessary to store the $Ru_3(CO)_{12}$ precursor in the ampoule under a CO containing atmosphere. However, in the method of this invention, immediately prior to deposition, the CO is evacuated from the ampoule, and pure Argon is substituted as the carrier gas. With the short deposition times envisaged, less than about 60 sec, there is no significant degradation of the precursor in the ampoule.

We previously noted that it may be possible to tolerate some CO in the precursor gas stream at levels significantly reduced from the practice of the prior art, but keeping it slightly more than zero. If a sufficiently thick capping layer (about 5 nm. maximum) can be grown with a reduced but nonzero CO flow, it would be desirable to do so, as this would assist in preserving the integrity of the $Ru_3(CO)_{12}$ in the source ampoule. Whether zero flow of CO or a flow that is substantially reduced over that of the prior art is preferred will depend on the details of the wiring structure to be capped and on the exact physical and chemical nature of the dielectric. While recognizing this possibility, the invention will be described below for the case in which CO is removed as completely as possible.

In the wiring arrays considered in this invention, the dielectric material preferably has a dielectric constant of less than about 3.0.

In one embodiment, the upper surface of the dielectric material is substantially coplanar with the upper surface of the at least one conductive material.

In another embodiment, the upper surface of the dielectric material is recessed relative to the upper surface of the at least one conductive material.

In yet another embodiment, the dielectric material has at least one Cu-containing conductive material embedded within the dielectric material.

In still another embodiment, the present method can further include the step of depositing a dielectric capping layer on the recessed dielectric material and the noble metal cap or depositing a dielectric capping layer on the coplanar dielectric material and the noble metal cap.

These embodiment illustrates the versatility of the present method in producing a variety of noble metal coated surfaces, as no substantial change in fabrication method would be required.

In the method of the present invention, the process is carried out in the following manner. A substrate, which is the wiring array to be capped, is introduced into vacuum chamber, which is the reactor, and placed in contact with a heater. Preferably, the base pressure of the reactor is less than $10^{-2}$ torr, more preferably is less than $10^{-4}$ torr, and most preferably it is less than $10^{-6}$. This vacuum requirement is only for the purpose of preventing the oxidation of the Cu wiring structure when it is introduced into the chamber. The substrate is then brought to deposition temperature, which is in the range of from about 150° C. to about 300° C., more preferably from about 150° C. to about 200° C., and most preferably, the deposition temperature is about 150° C. to about 180° C.

In contrast to the prior art of Ru CVD from carbonyl precursors, a valve connecting the ampoule to a pump is opened and CO is evacuated from the ampoule. During this process, Argon may be flowed through the ampoule to facilitate the purging of CO from the ampoule. Upon removal of sufficient CO from the ampoule, the valve connecting the ampoule and the pump is closed. Then a mass flow controller (MFC) is used to flow about 100 to about 400 sccm of Argon through the $Ru_3(CO)_{12}$ containing source ampoule. The resultant gas stream passes through a showerhead which directs it towards and onto the substrate. In contrast to the prior art of Ru CVD from carbonyl precursors, no CO is passed through the ampoule along with the Argon through the showerhead and onto the substrate.

As the precursor containing gas stream is flowing through the showerhead, a vacuum pump serves to maintain the pressure in the reactor between 1 torr and 0.01 torr, with 0.08 torr to 0.12 torr being preferred. This flow of precursor containing gas is allowed to proceed for a time from about 0.1 second to less than about 60 sec. Then the gas stream is shut off, the reactor is evacuated by means of a vacuum pump and the substrate is removed from the reactor. A valve connecting the ampoule to a vacuum pump is then opened and the argon in the ampoule is removed. This valve is then shut and the ampoule is refilled with CO. Thus, the integrity of the precursor in the ampoule under storage is maintained.

At this point the process can be optionally repeated. If it is to be repeated immediately, it is understood that certain optional aspects of the above procedure may be omitted.

This method enables the production of a noble metal cap disposed directly on the upper surface of the conductive material without substantially extending the noble metal cap onto an upper surface of the dielectric material or leaving a noble metal residue on it.

By removing the CO from the carrier gas stream, the deposition rate of the Ru onto the conductive material will be increased compared with the prior art practice of including the CO in the carrier gas stream. Thus the invention has the advantage of producing a thicker layer of Ru than would otherwise be possible using prior art processing methods. This increased thickness is highly desirable for the purpose of capping layer reliability.

Accordingly, the method of the present invention, which is a method of forming a noble metal cap on a conductive material embedded in a dielectric material in an interconnect structure, includes the step of:

contacting (i) a conductive material having a bare upper surface partially embedded in a dielectric material and (ii) vapor of a noble metal containing compound, in the presence of a carrier gas substantially free of carbon monoxide;

wherein said contacting step is carried out at a temperature, pressure and for a length of time sufficient to produce a noble metal cap disposed directly on said upper surface of said conductive material without substantially extending into an upper surface of said dielectric material or leaving a noble metal residue there onto.

The noble metal containing compound can be a noble metal complex comprising a noble metal and a ligand, such as, a noble metal carbonyl. The noble metal in the noble metal complex is selected from ruthenium, rhodium, platinum, palladium, and an alloy thereof. Preferably, the noble metal is ruthenium and the noble metal carbonyl is $Ru_3(CO)_{12}$, $Ru(CO)_5$, or a mixture thereof and more preferably, the noble metal carbonyl is $Ru_3(CO)_{12}$ such that the noble metal cap formed comprises ruthenium. However, if a noble metal cap of ruthenium alloy is desired, then ruthenium metal carbonyl containing at least one other noble metal selected from rhodium, platinum, and palladium is employed.

It should be understood in the above description of the prior art and the invention, not every step necessary for actual operation has been described, only those steps necessary to outline the process and illustrate the nature of the invention. It should be further understood that certain processing parameters, flows, pressures, times and the like may be dependent on the detailed nature of the reactor, and that some modifications of the conditions and values given above, which reflect our experience with a particular reactor, may be employed.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A method of forming a noble metal cap on a conductive material embedded in a dielectric material in an interconnect structure, comprising the sequential steps of:

storing a vapor of a noble metal compound under an atmosphere comprising carbon monoxide;

evacuating the carbon monoxide atmosphere to substitute the atmosphere with a carrier gas substantially free of carbon monoxide;

contacting a conductive material having a bare upper surface partially embedded in a dielectric material with the vapor of the noble metal containing compound in the presence of the carrier gas substantially free of carbon monoxide, wherein the dielectric material is exposed to the vapor;

wherein said contacting step is carried out at a temperature, pressure and for a length of time sufficient to produce a noble metal cap disposed directly on said upper surface of said conductive material without substantially extending into an upper surface of said dielectric material and/or leaving a noble metal residue there onto, wherein the upper surfaces of the dielectric material and the conductive material are co-planar.

2. The method of claim 1, wherein said noble metal containing compound is a noble metal complex comprising a noble metal and a ligand.

3. The method of claim 2, wherein said noble metal complex is a noble metal carbonyl.

4. The method of claim 3, wherein said noble metal in said noble metal complex are selected from the group consisting of:

ruthenium, rhodium, platinum, palladium, and an alloy thereof.

5. The method of claim 4, wherein said noble metal is ruthenium.

6. The method of claim 5, wherein said noble metal carbonyl is selected from the group consisting of: $Ru_3(CO)_{12}$, $Ru(CO)_5$, and a mixture thereof.

7. The method of claim 6, wherein said noble metal carbonyl is $Ru_3(CO)_{12}$.

8. The method of claim 1, wherein said noble metal cap comprises ruthenium.

9. The method of claim 1, wherein said noble metal cap comprises a ruthenium alloy with at least one other noble metal selected from the group consisting of rhodium, platinum, and palladium.

10. The method of claim 1, wherein said dielectric material has a dielectric constant of less than about 3.0.

11. The method of claim 1, wherein said contacting step is carried out at a temperature from about 150° C. to about 180° C.

12. The method of claim 1, wherein said contacting step is carried out at a pressure from about 10 torr to about 0.001 torr.

13. The method of claim 12, wherein said pressure is from about 0.12 torr to about 0.08 torr.

14. The method of claim 1, wherein said carrier gas is selected from the group consisting of helium, argon, nitrogen, and a mixture thereof.

15. The method of claim 1, wherein said contacting step is carried out for a period of time from about 1 second to about 10 minutes.

16. The method of claim 1, wherein said process is carried out as a batch process.

17. The method of claim 1, wherein said process is carried out as a continuous process.

18. The method of claim 1, wherein said upper surface of said dielectric material is substantially coplanar with said upper surface of said at least one conductive material.

19. The method of claim 1, wherein said upper surface of said dielectric material is recessed relative to said upper surface of said at least one conductive material.

20. The method of claim 19, further comprising:
depositing a dielectric capping layer on said recessed dielectric material and said noble metal cap.

21. The method of claim 1, wherein said dielectric material has at least one Cu-containing conductive material embedded within said dielectric material.

22. The method of claim 1, further comprising:
depositing a dielectric capping layer on said coplanar dielectric material and said noble metal cap.

23. The method of claim 1, wherein said vapor of said noble metal containing compound is brought into contact with said conductive material through said substantially carbon monoxide free carrier gas.

* * * * *